United States Patent [19]

Flowers et al.

[11] 4,009,299

[45] Feb. 22, 1977

[54] TIN STRIP FORMULATION FOR METAL TO GLASS SEAL DIODES

[75] Inventors: Dervin L. Flowers; Richard L. Greeson, both of Scottsdale, Ariz.

[73] Assignee: Motorola, Inc., Chicago, Ill.

[22] Filed: Oct. 22, 1975

[21] Appl. No.: 624,681

[52] U.S. Cl. ................................ 427/82; 156/655; 156/98; 252/791; 427/142
[51] Int. Cl.$^2$ ...................... B05D 5/12; B23P 7/00
[58] Field of Search ............ 427/82, 140, 142, 307, 427/309, 430, 435, 436; 156/17, 98, 2, 6; 134/41; 252/79.1, 142, 143, 162, 171, 173, DIG. 8, DIG. 10, DIG. 14; 228/119; 264/36; 29/401

[56] References Cited

UNITED STATES PATENTS

| | | | |
|---|---|---|---|
| 2,721,119 | 10/1955 | Bauch | 252/142 X |
| 3,072,579 | 1/1963 | Newman | 252/143 |

*Primary Examiner*—Thomas J. Herbert, Jr.
*Assistant Examiner*—Bruce H. Hess
*Attorney, Agent, or Firm*—Henry T. Olsen

[57] ABSTRACT

Immersion of semiconductor devices, particularly diodes, having a defective tin plating thereon in a solution of 5 – 20 percent by weight trichloroacetic acid, 0.1 to 5 percent by weight of a compound selected from the group consisting of cationic, anionic, and nonionic surfactants and the balance water effectively removes the tin therefrom. The process is effective at room temperature but preferably is performed at approximately 100° C.

3 Claims, No Drawings

TIN STRIP FORMULATION FOR METAL TO GLASS SEAL DIODES

RELATED APPLICATION

A related application, Ser. No. 430,431, filed Jan. 3, 1974 by Richard L. Greeson and Elliott M. Philofsky, and assigned to the same assignee as herein is copending.

BACKGROUND OF THE INVENTION

This invention relates to the manufacture of semiconductor devices and more particularly to the manufacture of semi-conductor diodes having tin plated leads.

As disclosed in the above mentioned related application, a semiconductor device is manufactured by assembling a semi-conductor chip with metal slugs within a glass tube and then sealing the members together. Leads extending therefrom are plated with tin to permit ready connection of the devices into circuits. The tin plating may result in rejection of otherwise electrically satisfactory devices.

Previous attempts to remove the defective plating, as by a dilute hydrochloric acid solution, has not been satisfactory because such stripping solutions also attack the borate glass-to-metal seal.

SUMMARY OF THE INVENTION

It is an object of the invention to provide an improved process for the stripping of tin plating, particularly from semiconductor diodes.

A further object of the invention is to provide a reclamation process for semiconductor devices having glass-to-metal seals.

In accordance with these objects, there is provided a process for reclaiming semiconductor devices comprising the steps of:

providing a semiconductor device having a defective tin plating on the leads thereof; and Immersing said devices in a solution of 5 – 20 percent by weight trichloroacetic acid, 0.1 to 5 percent by weight of a compound selected from the group consisting of cationic, anionic, and nonionic surfactants, and the balance water for a period of time sufficient to strip the tin therefrom.

COMPLETE DESCRIPTION

In the manufacture of a semiconductor device which may be, for example, a zener diode, a semiconductor die or chip has a pair of metal slugs bonded to respective surfaces of the die. Terminal conductors are attached to and extend axially from the slugs and a glass sleeve is bonded around the slugs. To prepare the completed device for attachment as to a circuit board, the semiconductor device leads are plated, as in a sulfuric acid-stannous sulfate bath with tin. In some cases, because of surface conditions of the bath or conditions of the leads, the plating is non-adherent or less than sufficient thickness to satisfy quality inspection. Since the device is electrically satisfactory except for the plating, the plating should be removed prior to again replating the conductors.

In accordance with this invention, there is provided a stripping solution consisting of 5 – 20 percent trichloroacetic acid, 0.1 to 5 percent of a compound selected from the group consisting of cationic, anionic, and nonionic surfactants and the balance water. The defective diodes are immersed therein for approximately 5 – 10 minutes while the solution has preferably maintained at a temperature of approximately 100° C. Treatment in accordance with the above, effectively removes the defective tin plating from the devices and the devices may then be replated.

Cationic surfactants may be a di- or tri-alkyl amine hydrochloride such as a trialkanol amine hydrochloride where alkanol is 2 - hydroxy ethyl and 2 - alkyd amine. Anionic surfactants may be a sodium slat of a dialkyl sulfosuccinic acid where alkyl is octyl or dodecyl benzene sulfonate. A nonionic may be one of a homologous series of nonyl phenoxy polyethanols.

Particular examples of the effectiveness of the process is given in the following examples:

| Example | TCA (%W) | Surfactant (%W) | Solution Temp (° C) | Time to Clear (min) | Comments |
|---|---|---|---|---|---|
| 1 | 5 | 0 | 25 | 195 | Small spots on tin left, dull finish |
| 2 | 5 | 0.5 AOT | 25 | 170 | No tin left, no spots, matte finish |
| 3 | 10 | 0 | 25 | 90 | Like No. 1, smaller spots of tin left |
| 4 | 10 | .5 AOT | 25 | 75 | Like No. 2, shinier finish |
| 5 | 15 | 0 | 25 | 65 | A few tiny tin spots, satin finish |
| 6 | 15 | .5 AOT | 25 | 55 | Free of all tin, specular finish |
| 7 | 5 | .1 CO 880 | 100 | 7.5 | No tin seen, matte finish |
| 8 | 10 | 0 | 100 | 5 | A few islands of slower reacting tin (2–4 mils), dull |
| 9 | 10 | .1 CO 880 | 100 | 3.5 | Very clean, shiney |
| 10 | 15 | .1 CO 880 | 100 | 2.2 | Very clean, specular basis metal |
| 11 | 10 | .5 DBS | 100 | 4.0 | Clean satin finish |
| 12 | 10 | 0.1 DDPA | 100 | 3.5 | Very clean, shiney |
| 13 | 10 | .5 DDPA | 100 | 2.5 | Very clean, specular |
| 14 | 10 | .1 BDEA | 80 | 4.5 | Very clean, shiney |
| 15 | 10 | .5 BDEA | 80 | 6.0 | Very clean, specular |

Surfactants given in the above are:
(1) AOT is Aerosol AOT by American Cyanimid which is a sodium salt of a dialkyl sulfosuccinic acid -continued

| Example | TCA (%W) | Surfactant (%W) | Solution Temp (° C) | Time to Clear (min) | Comments |
|---|---|---|---|---|---|
| (2) | | where alkyl is octyl. DBS is dodecyl benzene sulfonate. | | | |
| (3) | | CO 880 is Igepal CO 880 by GAF which is a nonionic surfactant | | | |
| (4) | | DDPA is didodcyl phenylamine hydrochloride. | | | |
| (5) | | BDEA is benzl dodecyl ethanol amine hydrochloride. | | | |

Thus, it will be seen that there is provided an effective treatment for the stripping of the tin from tin plated semiconductor devices particularly diodes which is effective and economic.

What is claimed is:

1. A process for the reclamation of semiconductor devices comprising:
   providing semiconductor devices having a defective tin plating thereon; and
   immersing said devices, for about 5–10 minutes, in a solution of 5–20 percent by weight trichloroacetic acid, 0.1 to 5 percent by weight of a compound selected from the group consisting of cationic, anionic, nonionic surfactants, and the balance water.

2. A process as recited in claim 1 wherein said solution is maintained at a temperature of approximately 100° C.

3. A process as recited in claim 2 and further including the step of replating said devices in a sulfuric acid (stannous sulfate solution).

* * * * *